US011367758B2

(12) United States Patent
Jiang et al.

(10) Patent No.: US 11,367,758 B2
(45) Date of Patent: Jun. 21, 2022

(54) DISPLAY SUBSTRATE AND METHOD FOR MANUFACTURING THE SAME, DISPLAY PANEL AND DISPLAY DEVICE (71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhiliang Jiang, Beijing (CN); Pan Zhao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 168 days.

(21) Appl. No.: 16/643,362

(22) PCT Filed: Aug. 27, 2019

(86) PCT No.: PCT/CN2019/102752
§ 371 (c)(1),
(2) Date: Feb. 28, 2020

(87) PCT Pub. No.: WO2020/043079
PCT Pub. Date: Mar. 5, 2020

(65) Prior Publication Data
US 2021/0074771 A1 Mar. 11, 2021

(30) Foreign Application Priority Data
Aug. 27, 2018 (CN) .......................... 201810980319.3

(51) Int. Cl.
*H01L 27/32* (2006.01)
*H01L 51/52* (2006.01)
(Continued)

(52) U.S. Cl.
CPC ............ *H01L 27/323* (2013.01); *G06F 3/044* (2013.01); *H01L 27/3244* (2013.01);
(Continued)

(58) Field of Classification Search
CPC ............... H01L 27/323; H01L 27/3244; H01L 51/5253; H01L 51/56; H01L 2227/323;
(Continued)

(56) References Cited

U.S. PATENT DOCUMENTS

2015/0042346 A1    2/2015  Oh et al.
2015/0160767 A1*   6/2015  Song ................... G06F 3/0445
                                              345/174

(Continued)

FOREIGN PATENT DOCUMENTS

CN    104347822 A    2/2015
CN    104900681 A    9/2015
(Continued)

OTHER PUBLICATIONS

Office Action of CN Application No. 201810980319.3 and English translation, dated Mar. 19, 2020, 15 pages.
(Continued)

*Primary Examiner* — Kyoung Lee
(74) *Attorney, Agent, or Firm* — Muncy, Geissler, Olds & Lowe, P.C.

(57) ABSTRACT

A display substrate and a method for manufacturing the same, a display panel and a display device are provided. The display substrate includes a base substrate, a display component on the base substrate, and an encapsulation layer
(Continued)

covering the display component, where the encapsulation layer includes an organic layer and an inorganic layer that are stacked alternately. A detection capacitor is further provided in a peripheral region of the display substrate. The detection capacitor includes a first electrode plate on a side of the encapsulation layer close to the base substrate, and a second electrode plate on a side of the encapsulation layer away from the base substrate.

20 Claims, 4 Drawing Sheets

(51) Int. Cl.
  *G06F 3/044* (2006.01)
  *H01L 51/56* (2006.01)
(52) U.S. Cl.
  CPC .......... *H01L 51/5253* (2013.01); *H01L 51/56* (2013.01); *G06F 2203/04103* (2013.01); *H01L 2227/323* (2013.01)
(58) Field of Classification Search
  CPC . H01L 27/3225; H01L 51/5256; G06F 3/044; G06F 2203/04103; G06F 3/0412; G06F 3/0443; G06F 3/0446; G06F 2203/04111
  See application file for complete search history.

(56) References Cited

U.S. PATENT DOCUMENTS

| | | |
|---|---|---|
| 2016/0307971 A1 | 10/2016 | Jeon |
| 2016/0365395 A1 | 12/2016 | Xu et al. |
| 2018/0032189 A1 | 2/2018 | Lee et al. |
| 2018/0102502 A1 | 4/2018 | Kim et al. |
| 2018/0175116 A1 | 6/2018 | Song et al. |
| 2019/0097162 A1 | 3/2019 | Wang |

FOREIGN PATENT DOCUMENTS

| | | |
|---|---|---|
| CN | 106057853 A | 10/2016 |
| CN | 106505089 A | 3/2017 |
| CN | 107491209 A | 12/2017 |
| CN | 107665911 A | 2/2018 |
| CN | 107742635 A | 2/2018 |
| CN | 107919293 A | 4/2018 |
| CN | 108061983 A | 5/2018 |
| CN | 108206198 A | 6/2018 |
| CN | 109119445 A | 1/2019 |
| JP | 2015056335 A | 3/2015 |

OTHER PUBLICATIONS

International Search Report of PCT/CN2019/102752 and English translation, dated Dec. 2, 2019, 13 pages.
An Office Action corresponding to CN Application No. 201810980319.3 dated Jan. 28, 2021 is attached, 15 pages with English Translation.

* cited by examiner

DISPLAY SUBSTRATE AND METHOD FOR MANUFACTURING THE SAME, DISPLAY PANEL AND DISPLAY DEVICE

CROSS-REFERENCE TO RELATED APPLICATIONS

This application is the U.S. national phase of PCT Application No. PCT/CN2019/102752 filed on Aug. 27, 2019, which claims a priority to Chinese Patent Application No. 201810980319.3 filed on Aug. 27, 2018, both disclosures of which are incorporated in their entireties by reference herein.

TECHNICAL FIELD

The present disclosure relates to the field of display technologies, and in particular to a display substrate and a method for manufacturing the same, a display panel and a display device.

BACKGROUND

In related technologies, a display device with an Organic Light-Emitting Diode (OLED) display substrate is highly sensitive to water and oxygen. Once intruded by water or oxygen, the display device may be damaged, and the display substrate may not operate normally. Generally, the display substrate is provided with an encapsulation layer to protect the display device.

The encapsulation layer in related technologies usually includes organic layers and inorganic layers that are alternately stacked. During the forming of an organic layer, since the forming process is affected by factors such as a processing technology and a shape of a screen, the material of the organic layer may extend beyond an original position and undesirably extend to a peripheral region of the display substrate (which is usually referred to as overflow). When the organic layer overflows, external water or oxygen easily invades along an overflow channel formed due to the overflow of the organic layer, and causes a damage to the display substrate. The detection of water and oxygen invasion due to the overflow of an organic layer is usually complicated.

SUMMARY

In a first aspect, a display substrate is provided according to an embodiment of the present disclosure, which includes a base substrate, a display component on the base substrate, and an encapsulation layer covering the display component. The encapsulation layer includes an organic layer and an inorganic layer that are stacked, and a detection capacitor is further provided in a peripheral region of the display substrate. The detection capacitor includes a first electrode plate on a side of the encapsulation layer close to the base substrate, and a second electrode plate on a side of the encapsulation layer away from the base substrate.

Optionally, the display component includes a source-drain metal layer pattern or an anode layer; and the first electrode plate and the source-drain metal layer pattern of the display component are made of a same material and on a same layer, or the first electrode plate and the anode layer of the display component are made of a same material and on a same layer.

Optionally, the display substrate further includes a touch electrode on the side of the encapsulation layer away from the base substrate, and the second electrode plate of the detection capacitor and the touch electrode are made of a same material and on a same layer.

Optionally, the second electrode plate includes a structure of a Ti layer, an Al layer and the Ti layer that are laminated.

Optionally, the display substrate further includes a first blocking structure and a second blocking structure that are in the peripheral region of the display substrate, and an orthographic projection of the detection capacitor onto the base substrate is between the first blocking structure and the second blocking structure.

Optionally, the first electrode plate is of a ring shape and around the peripheral region of the display substrate, and a shape of the second electrode plate corresponds to a shape of the first electrode plate.

Optionally, the encapsulation layer includes a first inorganic layer, the organic layer, and a second inorganic layer that are sequentially stacked.

In a second aspect, a display panel is further provided according to an embodiment of the present disclosure, which includes the display substrate according to any of the above embodiments.

In a third aspect, a display device is further provided according to an embodiment of the present disclosure, which includes the above display panel.

In a fourth aspect, a method for manufacturing a display substrate is further provided according to an embodiment of the present disclosure. The display substrate includes a base substrate and a display component on the base substrate, and the method includes:

forming a first electrode plate of a detection capacitor in a peripheral region of the display substrate;

forming an encapsulation layer covering the display component; and forming a second electrode plate of the detection capacitor on a side of the encapsulation layer away from the base substrate.

Optionally, the display component includes a source-drain metal layer pattern or an anode layer, and forming the first electrode plate of the detection capacitor includes: forming the first electrode plate and the source-drain metal layer pattern of the display component simultaneously through one patterning process; or forming the first electrode plate and the anode layer of the display component simultaneously through one patterning process.

Optionally, the display substrate further includes a touch electrode, and forming the second electrode plate of the detection capacitor includes: forming the second electrode plate and the touch electrode simultaneously through one patterning process.

Optionally, the display substrate further includes a first blocking structure and a second blocking structure, and orthographic projections of the first electrode plate and second electrode of the detection capacitor onto the base substrate are between the first blocking structure and the second blocking structure.

BRIEF DESCRIPTION OF THE DRAWINGS

In order to illustrate technical solutions of embodiments of the present disclosure more clearly, drawings used in description of the embodiments of the present disclosure are briefly described below. Obviously, the drawings in the following description are just some embodiments of the present disclosure. For those of ordinary skill in the art, other drawings can be obtained based on these drawings without creative effort.

DETAILED DESCRIPTION

Technical solutions in embodiments of the present disclosure will be clearly and completely described below with reference to the accompanying drawings in the embodiments of the present disclosure. Obviously, the described embodiments are part of the embodiments of the present disclosure, but not all of the embodiments. Based on the embodiments in the present disclosure, all other embodiments obtained by a person of ordinary skill in the art without creative efforts shall fall within the protection scope of the present disclosure.

As shown in FIG. 1 to FIG. 4, a display substrate is provided according to an embodiment of the present disclosure, which includes: a base substrate, a display component 110 on the base substrate, and an encapsulation layer 120 covering the display component 110.

The display component 110 in this embodiment mainly refers to a structure or a functional film layer including, but not limited to, a thin film transistor (TFT) structure, an anode, a cathode, and a light-emitting layer. The light-emitting layer may further include a hole transport layer (HTL), an electro luminescent (EL) layer 111, an electron transport layer (ETL). The above display component 110 may adopt a device structure in the related technologies or other device structures that can be used for displaying or emitting light, which are not further limited and described herein. In examples shown in FIG. 1 to FIG. 4, the encapsulation layer 120 may include an organic layer 122 and inorganic layers 121 and 123 that are stacked.

As shown in FIG. 1 to FIG. 4, in an embodiment, the encapsulation layer 120 at least includes a first inorganic layer 121, the organic layer 122 and a second inorganic layer 123 that are sequentially stacked. The organic layer 122 may adopt an organic ink, and may be formed by an inkjet printing method or other suitable methods that can be used to manufacture the encapsulation layer 120.

The display substrate further includes a detection capacitor 130 located in a peripheral area of the display substrate. A first electrode plate 131 of the detection capacitor 130 is formed on a side of the encapsulation layer 120 close to the base substrate, and a second electrode plate 132 of the detection capacitor 130 is formed on a side of the encapsulation layer 120 far away from the base substrate.

Figure 6:
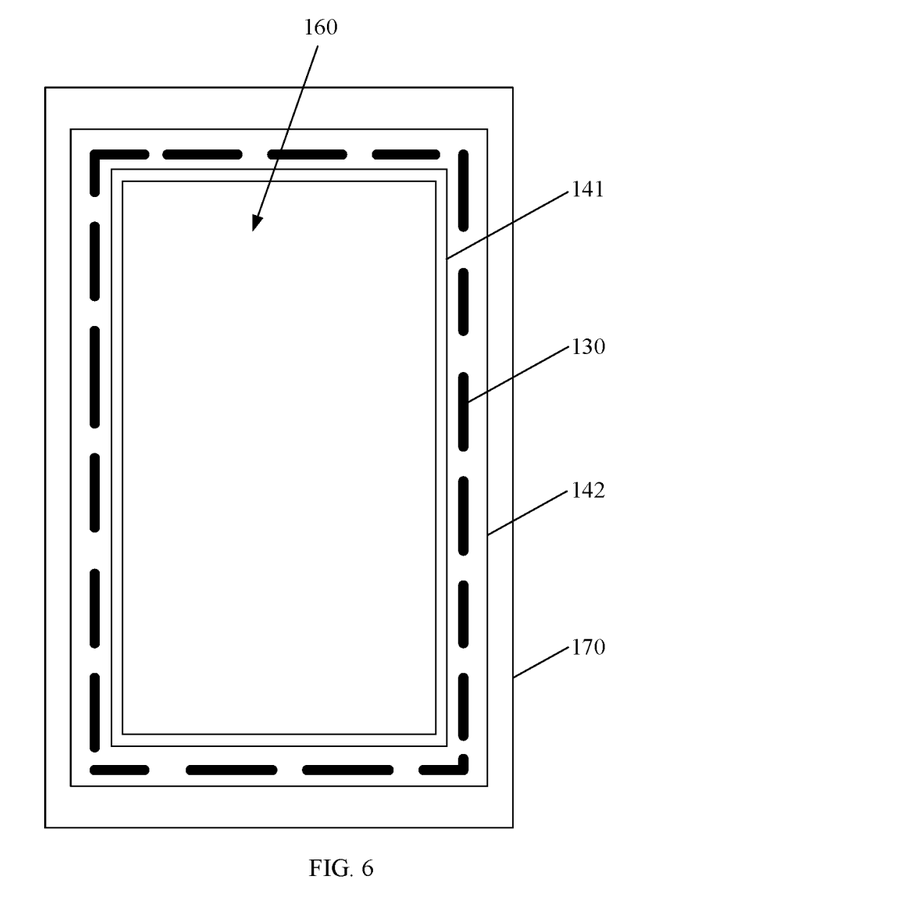
FIG. 6 is a schematic diagram of a display substrate according to another embodiment of the present disclosure.
Figure 7:
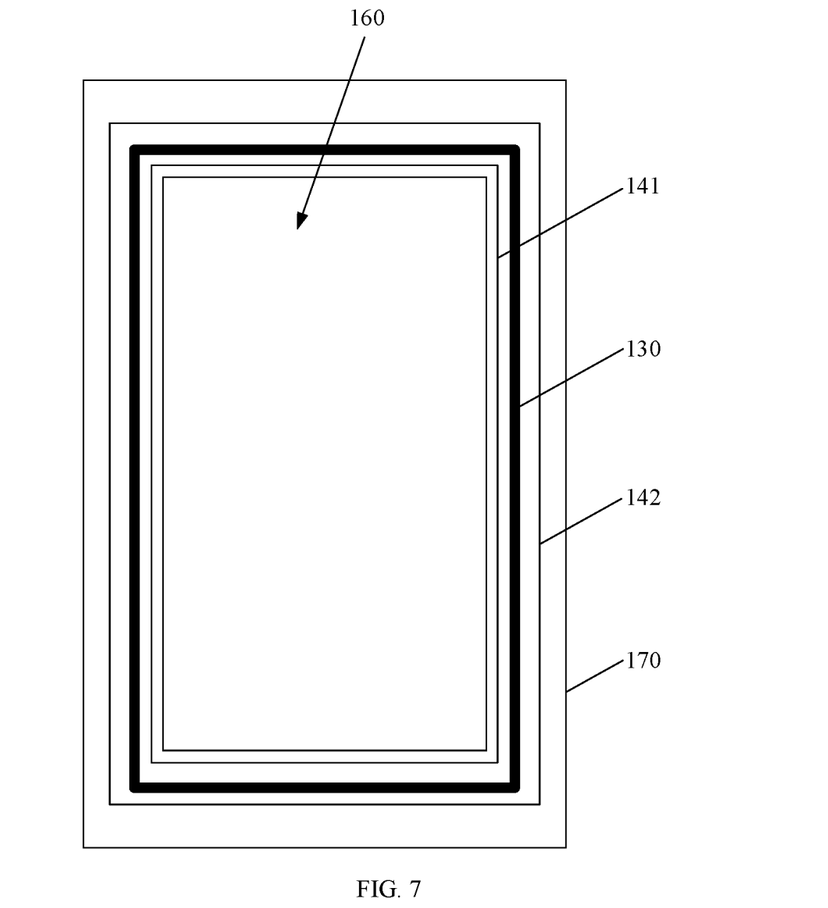
FIG. 7 is a schematic diagram of a display substrate according to another embodiment of the present disclosure.

The peripheral region of the display substrate as shown in FIG. 6 and FIG. 7 refers to an edge position between an effective display area (AA) 160 of the display substrate and a frame 170 of the display substrate. According to some embodiments of the present disclosure, the detection capacitor 130 is arranged in the peripheral region, and is configured to determine whether an organic layer in the encapsulation layer of the display substrate overflows to the peripheral region.

In the technical solutions of the embodiment, the detection capacitor 130 is provided to detect whether an overflow phenomenon occurs to the organic layer 122 of the encapsulation layer 120. The detection capacitor 130 includes the first electrode plate 131 and the second electrode plate 132, and the first electrode plate 131 and the second electrode plate 132 are respectively arranged on two sides of the encapsulation layer 120 at the peripheral region of the display substrate.

When the organic layer 122 overflows or water or oxygen invades the display substrate along an overflow channel formed due to the overflow of the organic layer, electrolytes between the first electrode plate 131 and the second electrode plate 132 may change as compared with the ideal situation.

Figure 1:
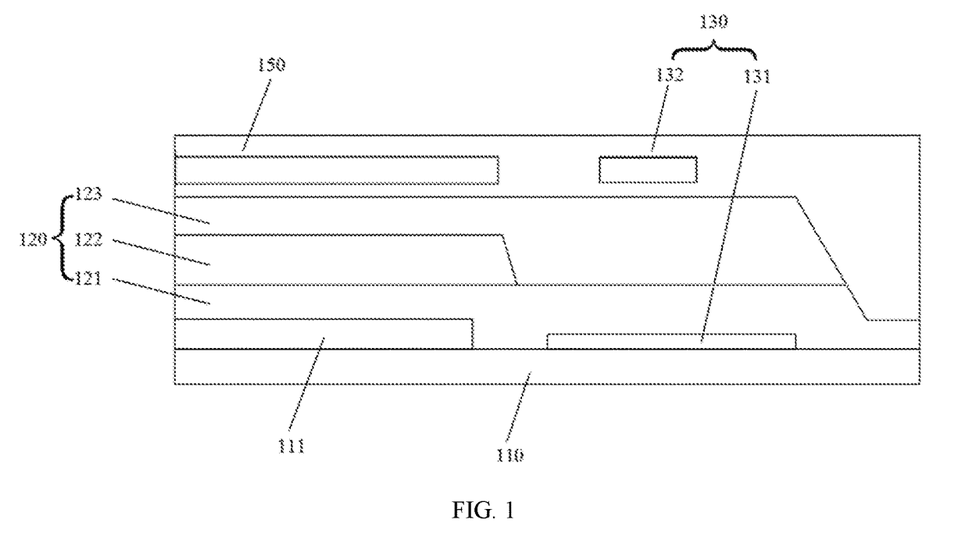
FIG. 1 is a schematic diagram of a display substrate according to an embodiment of the present disclosure.
Figure 2:
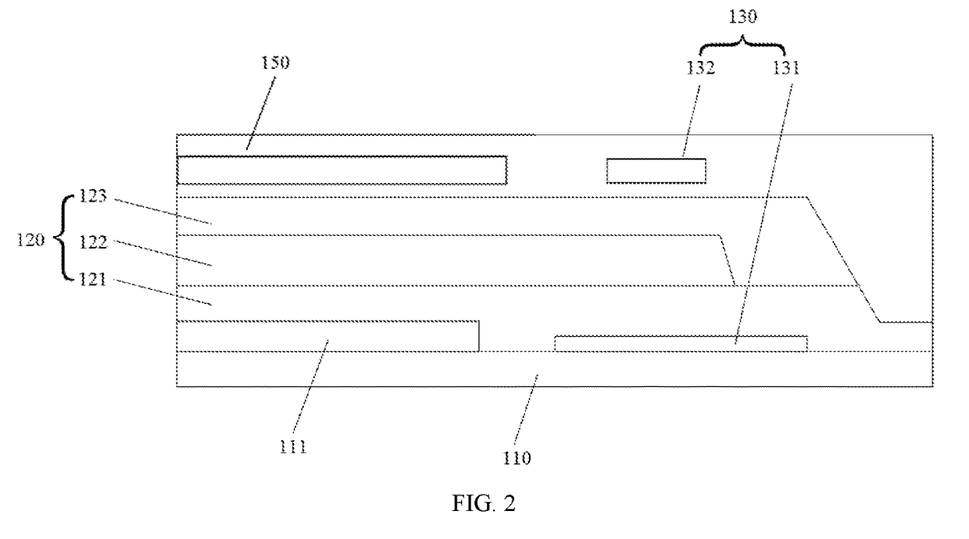
FIG. 2 is a schematic diagram showing an overflow state of an organic layer of the display substrate in FIG. 1.
Figure 3:
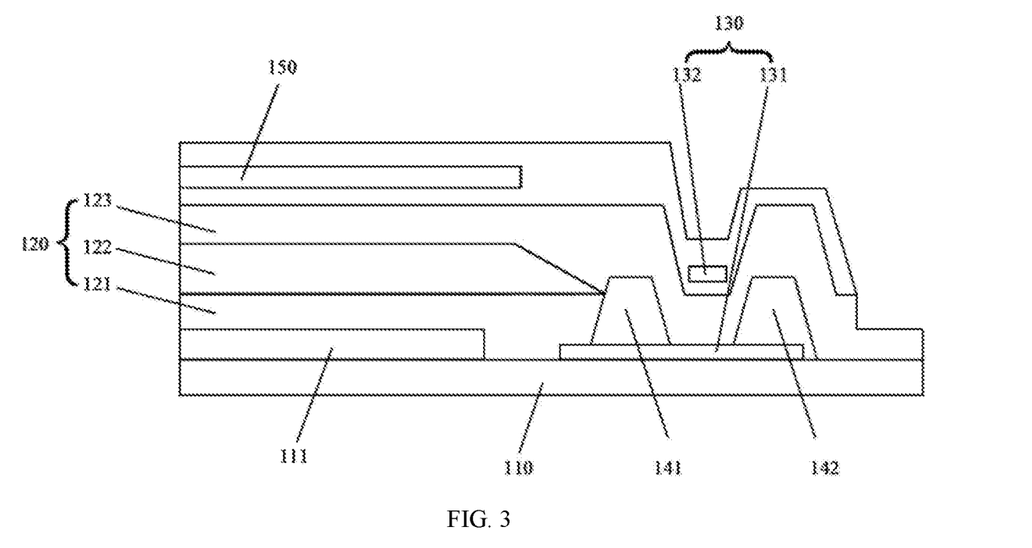
FIG. 3 is a schematic diagram of a display substrate according to another embodiment of the present disclosure.
Figure 4:
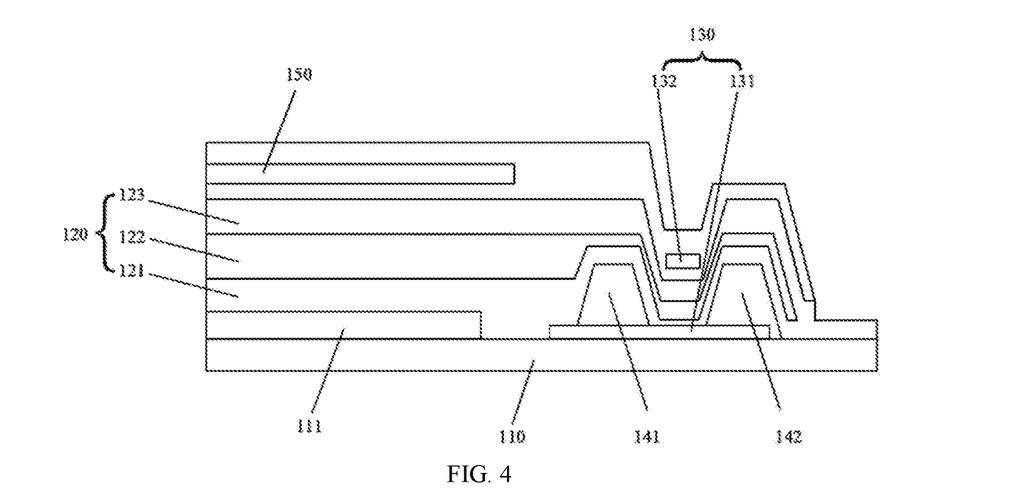
FIG. 4 is a schematic diagram showing an overflow state of the organic layer of the display substrate in FIG. 3.

Optionally, as shown in FIG. 1 and FIG. 3, for a display substrate in ideal situation, i.e., a display substrate where no overflow occurs, the substance between the first electrode plate 131 and the second electrode plate 132 is an inorganic material of the encapsulation layer 120. As shown in FIG. 2 and FIG. 4, for a display substrate where the overflow occurs, the substance between the first electrode plate 131 and the second electrode plate 132 is an organic material and an inorganic material of the encapsulation layer 120; and further, if oxygen and water have intruded along the overflow channel, the substance between the first electrode plate 131 and the second electrode plate 132 further includes the water and the oxygen.

The substance located between the first electrode plate 131 and the second electrode plate 132 serves as an electrolyte of the detection capacitor 130. The change of the electrolyte may cause a capacitance between the first electrode plate 131 and the second electrode plate 132 to change. By detecting a capacitance value of the detection capacitor 130 formed between the first electrode plate 131 and the second electrode plate 132, it is able to conveniently and quickly determine whether the organic layer 122 of the encapsulation layer 120 overflows, that is, whether the organic layer 122 extends to a region between the first electrode plate 131 and the second electrode plate 132 of the detection capacitor 130.

During implementation, a display substrate that is determined to have no overflow phenomenon in the organic layer 122 may be selected, and a capacitance value of the detection capacitor 130 is measured as a reference capacitance value under a normal condition; or in a case that electrolytes between the first electrode plate 131 and the second electrode plate 132 are an inorganic material of the encapsulation layer 120, a capacitance value of the detection capacitor 130 is obtained by theoretical calculation and is taken as a reference capacitance value.

When it is detected that a difference between a capacitance value of a detection capacitor 130 of a certain display substrate and the reference capacitance value is greater than a set threshold, it may be considered that the organic layer 122 of the display substrate has an overflow phenomenon; and when it is detected that a difference between a capacitance value of a detection capacitor 130 of a certain display substrate and the reference capacitance value is within an allowable range (for example, less than or equal to a threshold value), the display substrate may be deemed in a normal state.

In an embodiment of the present disclosure, a detection capacitor 130 is provided on the edge of the encapsulation layer 120. In a case that the organic layer 122 does not overflow, the electrolytes between the first electrode plate 131 and the second electrode plate 132 are inorganic materials of the encapsulation layer 120. If the organic layer 122 overflows, the electrolytes between the first electrode plate 131 and the second electrode plate 132 are the organic material and inorganic material of the encapsulation layer 120, which results in a deviation in the capacitance value between the first electrode plate 131 and the second electrode plate 132, as compared with the reference capacitance value, so that the overflow of the organic layer 122 can be detected.

In an embodiment, the first electrode plate 131 may be an electrode plate separately formed through an additional patterning process. For example, the first electrode plate 131 is manufactured before the encapsulation layer 120 is formed.

In an optional implementation manner, the first electrode plate 131 is formed with a same material and on a same layer as a source-drain metal layer pattern or an anode layer of the display component 110, that is, forming a pattern of the first electrode plate 131 when forming the drain-source metal layer or the anode layer pattern of the display component 110. The production process can be simplified, as compared to manufacturing the first electrode plate 131 exclusively through an additional patterning process.

Similarly, the second electrode plate 132 in an embodiment may also be an electrode plate separately formed through an additional patterning process. For example, after the encapsulation layer 120 is formed, the second electrode plate 132 is formed at a position corresponding to the first electrode plate 131, so that a position where the organic layer 122 may overflow is between the first electrode plate 131 and the second electrode plate 132.

According to some embodiments of the present disclosure, the first electrode plate 131 and the second electrode plate 132 of the detection capacitor 130 may be made of a suitable conductive material, such as a capacitor electrode plate made of a metal material. According to some embodiments, the first electrode plate 131 and the second electrode plate 132 may be electrode plates made of aluminum.

In an optional embodiment, the above technical solution is applied to a display substrate with a FMLOC structure. The display substrate with the FMLOC structure refers to a display substrate further provided with a touch sensor on a thin film encapsulation layer (TFE) 120.

According to some embodiments of the present disclosure, the touch sensor of the display substrate further includes a touch electrode 150 on the encapsulation layer 120, and the second electrode plate 132 of the detection capacitor 130 may be arranged on the same layer and made of the same material as the touch electrode 150.

According to some embodiments of the present application, when the pattern of the touch electrode 150 is formed, the pattern of the second electrode plate 132 may be formed at the same time, which can also have the effect of simplifying the production process. A material of the second electrode plate 132 is the same as that of the touch electrode 150, which, for example, may be a Ti—Al—Ti (titanium-aluminum-titanium) metal laminated structure. Each inorganic layer is usually made of an oxide of silicon.

Figure 5:
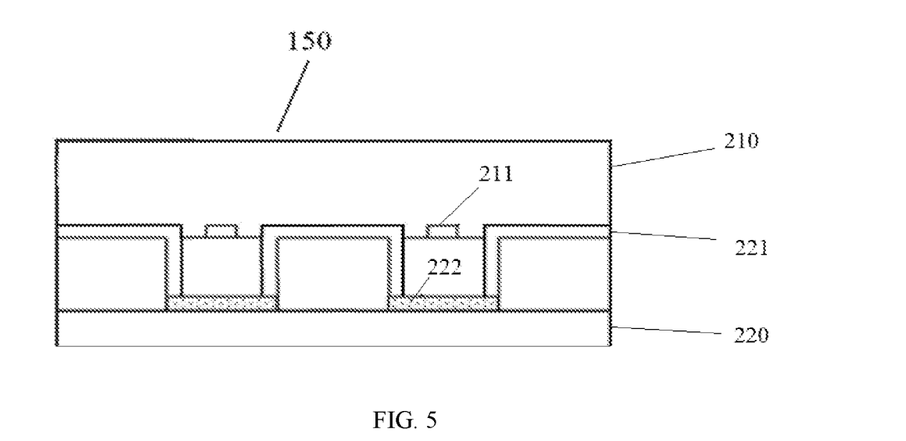
FIG. 5 is an exemplary cross-sectional view of a touch electrode according to an embodiment of the present disclosure.

According to some embodiments of the present disclosure, as shown in FIG. 5, the touch electrode 150 may be configured to include first electrodes 211 and second electrodes 221, where an extending direction of the first electrodes 211 is perpendicular to an extending direction of the second electrodes 221, and touch detection is achieved through a mutual capacitance structure formed between the first electrodes and the second electrodes. As shown in FIG. 5, metal bridges 222 are configured to connect the second electrodes 221 that are separated apart from each other in the lateral direction (a horizontal direction shown in FIG. 5). The first electrodes 211 and the second electrodes 221 may be disposed on the same layer. At least one of the first electrode 211 or the second electrode 221 may be a structure of a Ti metal layer, an Al metal layer and the Ti metal layer that are laminated. In addition, the touch electrode 150 may further include passivation layers 210 and 220 that are disposed on both sides of the electrode layer, respectively. The second electrode plate 132 may be arranged in the same layer and made of the same material as the first electrodes 211, or may be arranged in the same layer and made of the same material as the metal bridges 222.

Further, in order to reduce the overflow possibility of the organic layer 122 of the encapsulation layer 120, a blocking structure (dam) is provided at the edge of the encapsulation layer. It should be appreciated that the closer to the edge of the encapsulation layer 120 is, the smaller the thickness of each inorganic layer is, and it is easier for the organic layer 122 to overflow. In general, the blocking structure is disposed at the edge of the encapsulation layer 120.

Optionally, as shown in FIG. 3 and FIG. 4, the display substrate in an embodiment further includes a first blocking structure 141 and a second blocking structure 142 located at the edge of the encapsulation layer 120.

According to some embodiments of the present disclosure, an orthographic projection of the detection capacitor 130 onto the base substrate is between the first blocking structure 141 and the second blocking structure 142. In the actual manufacturing process, it is sometimes necessary to determine whether the encapsulation quality of a display substrate is qualified based on whether an organic layer overflows to a position where the first blocking structure 141 is located. Therefore, the above configuration that the orthographic projection of the detection capacitor 130 onto the base substrate is between the first blocking structure 141 and the second blocking structure 142 helps to provide reliable auxiliary determination when determining the encapsulation quality of the display substrate.

According to other embodiments, the orthographic projection of the detection capacitor 130 onto the base substrate may also be located between the effective display area (AA) 160 of the display substrate and the above first blocking structure 141; or the orthographic projection of the detection capacitor 130 onto the base substrate may also be located between the frame 170 of the display substrate and the above second blocking structure 142. A position of the detection capacitor 130 arranged in the peripheral region of the base substrate can be designed according to actual needs, which is not specifically limited in the present disclosure.

By providing the first blocking structure 141 and the second blocking structure 142, the possibility that the organic layer 122 overflows can be reduced.

As shown in FIG. 3, in a case that the organic layer 122 does not overflow, the electrolytes between the first electrode plate 131 and the second electrode plate 132 include the inorganic material of the encapsulation layer 120. As shown in FIG. 4, in a case that the organic layer 122 overflows, a material of the organic layer 122 exists in a region between the first blocking structure 141 and the second blocking structure 142, and water or oxygen may exist. In this case, the electrolytes between the first electrode plate 131 and the second electrode plate 132 include an organic material of the encapsulation layer 120.

When a difference between a capacitance value of the detection capacitor 130 between the first blocking structure 141 and the second blocking structure 142 and a predetermined reference capacitance value exceeds a threshold value, it may be considered that the organic layer 122 overflows, and it can be considered that the difference is not caused by other interference factors or errors, which can improve the accuracy and reliability of detection results.

As shown in FIG. 6, the detection capacitor 130 is disposed between the effective display area (AA area) 160 and the frame 170. In a case that the first blocking structure 141 and the second blocking structure 142 are provided, the detection capacitor 130 may be disposed between the first blocking structure 141 and the second blocking structure 142.

In an embodiment of the present disclosure, there may be a plurality of detection capacitors 130. The plurality of detection capacitors 130 may be arranged at intervals along the edge of the encapsulation layer 120. For example, each detection capacitor 130 is disposed at a certain distance from an adjacent detection capacitor to detect whether the organic layer 122 overflows.

Optionally, as shown in FIG. 6, in some embodiments of the present disclosure, only one detection capacitor 130 may be provided. The detection capacitor 130 has a ring shape, and the detection capacitor 130 surrounds the encapsulation layer 120 along an edge of the encapsulation layer 120. Optionally, the first electrode plate 131 in this embodiment is disposed along the edge of the encapsulation layer 120 and surrounds the encapsulation layer. In this way, the first electrode plate 131 is actually a ring-shaped plate structure as a whole, and the second electrode plate 132 is arranged at a position corresponding to the first electrode plate 131, so that the above-mentioned detection capacitor 130 is formed between the first electrode plate 131 and the second electrode plate 132.

In this way, when the organic layer 122 overflows at any position, a capacitance of the detection capacitor 130 changes, which can improve the accuracy of detection.

An embodiment of the present disclosure further provides a display panel including the display substrate according to any of the above embodiments. Since the display panel in this embodiment includes the display substrate according to any of the above embodiments, at least all the technical effects described above can be achieved, and details are not described herein again.

An embodiment of the present disclosure further provides a display device including the above display panel. Therefore, at least all the technical effects mentioned above can also be achieved, which are not be repeated herein.

The display device may include at least one of: a mobile phone, a tablet computer, an e-book reader, an MP3 player, an MP4 player, a digital camera, a laptop portable computer, a vehicle-mounted computer, a desktop computer, a set-top box, a smart television (TV), or a wearable device.

The present disclosure further provides a method for manufacturing a display substrate. The display substrate includes a base substrate and a display component formed on the base substrate, and the manufacturing method includes:
  forming a first electrode plate 131 of a detection capacitor 130 in a peripheral region of the display substrate;
  forming an encapsulation layer 120 covering the display component; and
  forming a second electrode plate 132 of the detection capacitor 130 on a side of the encapsulation layer 120 away from the base substrate.

The manufacture of any display substrate in the above embodiments is given as an example, and in this embodiment, for the step of forming the encapsulation layer 120, any steps that can be used to form the encapsulation layer 120 can be referred to, which is not further limited herein. In an embodiment, the first electrode plate 131 of the detection capacitor 130 is formed before the encapsulation layer 120 is formed, and the second electrode plate 132 of the detection capacitor 130 is formed after the encapsulation layer 120 is formed.

The first electrode plate 131 and the second electrode plate 132 are located at edges of the encapsulation layer 120. During implementation, a position of the first electrode plate 131 is determined according to a position where the encapsulation layer 120 needs to be formed, and a pattern of the first electrode plate 131 is formed at the position. After the encapsulation layer 120 is formed, a pattern of the second electrode plate 132 is further formed. Positions and shapes of the first electrode plate 131 and the second electrode plate 132 should correspond to each other, so that a detection capacitor 130 is formed between the first electrode plate 131 and the second electrode plate 132.

In this way, if the organic layer 122 does not overflow, inorganic materials are between the first electrode plate 131 and the second electrode plate 132. If the organic layer 122 overflows, organic materials and inorganic materials are between the first electrode plate 131 and the second electrode plate 132, which may result in a change of a capacitance between the first electrode plate 131 and the second electrode plate 132. Therefore, the overflow of the organic layer 122 can be detected.

Further, in a case that the display substrate includes a first blocking structure 141 and a second blocking structure 142, according to some embodiments of the present disclosure, the first electrode plate 131 and the second electrode plate 132 are disposed in such a manner that orthographic projections of the first electrode plate 131 and the second electrode plate 132 onto the base substrate are between the first blocking structure 141 and the second blocking structure 142.

In a case that the display substrate includes the first blocking structure 141 and the second blocking structure 142, the possibility that the organic layer 122 overflows can be reduced. When the organic layer 122 does not overflow, a material of the organic layer 122, water and oxygen do not exist in a region between the first blocking structure 141 and the second blocking structure 142. When a difference between a capacitance value of the detection capacitor 130 between the first blocking structure 141 and the second blocking structure 142 and a predetermined reference capacitance value exceeds a threshold value, it may be considered that the organic layer 122 overflows, and it can be considered that the difference is not caused by other interference factors or errors, which can improve the accuracy and reliability of the detection results.

Further, the step of forming the first electrode plate 131 of the detection capacitor 130 includes: forming the first electrode plate 131 and the source-drain metal layer pattern of the display component 110 at a same time through one patterning process; or forming the first electrode plate 131 and the anode layer of the display component 110 at a same time through one patterning process.

In addition, the step of forming the second electrode plate 132 of the detection capacitor 130 includes: forming the second electrode plate 132 and the touch electrode 150 at a same time through one patterning process.

In an embodiment, the first electrode plate 131 and the second electrode plate 132 may be formed separately, and may also be formed respectively through a single patterning process when forming the source-drain metal layer pattern or the anode layer, and through a single patterning process when forming the touch electrode 150, which is good to simplify production processes.

The above embodiments are only specific implementations of the present disclosure, but the protection scope of the present disclosure is not limited hereto. Any changes or substitutions that are easily made by a person skilled in the art without departing from the technical scope disclosed in the present disclosure shall fall within the protection scope of present disclosure. Therefore, the protection scope of the present disclosure shall be subject to the protection scope of the appended claims.

What is claimed is:

1. A display substrate, comprising:
    a base substrate;
    a display component on the base substrate; and
    an encapsulation layer covering the display component, wherein the encapsulation layer comprises an organic layer and an inorganic layer that are stacked, a detection capacitor is further provided in a peripheral region of the display substrate, and the peripheral region is a region between an effective display area and a frame of the display substrate; and
    the detection capacitor comprises a first electrode plate on a side of the encapsulation layer close to the base substrate, and a second electrode plate on a side of the encapsulation layer away from the base substrate.

2. The display substrate according to claim 1, wherein the first electrode plate and the second electrode plate of the detection capacitor are made of a metal material.

3. The display substrate according to claim 1, wherein the display component comprises a source-drain metal layer pattern or an anode layer; and
    the first electrode plate and the source-drain metal layer pattern of the display component are made of a same material and on a same layer, or the first electrode plate and the anode layer of the display component are made of a same material and on a same layer.

4. The display substrate according to claim 1, further comprising a touch electrode on the side of the encapsulation layer away from the base substrate, wherein the second electrode plate of the detection capacitor and the touch electrode are made of a same material and on a same layer.

5. The display substrate according to claim 4, wherein the second electrode plate comprises a structure of a Ti layer, an Al layer and the Ti layer that are laminated.

6. The display substrate according to claim 4, wherein the touch electrode comprises a plurality of first touch electrodes, a plurality of second touch electrodes and a plurality of metal bridges, an extending direction of the plurality of first touch electrodes is perpendicular to an extending direction of the plurality of the second touch electrodes, and each of the plurality of metal bridges is configured to connect two adjacent second electrodes.

7. The display substrate according to claim 1, further comprising a first blocking structure and a second blocking structure that are in the peripheral region of the display substrate, wherein an orthographic projection of the second electrode plate onto the base substrate is between an orthographic projection of the first blocking structure onto the base substrate and an orthographic projection of the second blocking structure onto the base substrate.

8. The display substrate according to claim 1, further comprising a first blocking structure and a second blocking structure that are in the peripheral region of the display substrate, wherein an orthographic projection of the second electrode plate onto the base substrate is between an orthographic projection of the effective display area of the display substrate onto the base substrate and an orthographic projection of the first blocking structure onto the base substrate.

9. The display substrate according to claim 1, further comprising a first blocking structure and a second blocking structure that are in the peripheral region of the display substrate, wherein an orthographic projection of the second electrode plate onto the base substrate is between an orthographic projection of the frame of the display substrate onto the base substrate and an orthographic projection of the second blocking structure onto the base substrate.

10. The display substrate according to claim 7, wherein an orthographic projection of the first electrode plate onto the base substrate covers the orthographic projection of the first blocking structure onto the base substrate and the orthographic projection of the second blocking structure onto the base substrate.

11. The display substrate according to claim 1, wherein the first electrode plate is of a ring shape and around the peripheral region of the display substrate, and a shape of the second electrode plate corresponds to a shape of the first electrode plate.

12. The display substrate according to claim 1, wherein the encapsulation layer comprises a first inorganic layer, the organic layer, and a second inorganic layer that are sequentially stacked.

13. A display panel, comprising the display substrate according to claim 1.

14. A display device, comprising the display panel according to claim 13.

15. The display substrate according to claim 1, wherein the display component comprises a source-drain metal layer pattern and an anode layer; and
    the first electrode plate and the source-drain metal layer pattern of the display component are made of a same material and on a same layer, or the first electrode plate and the anode layer of the display component are made of a same material and on a same layer.

16. A method for manufacturing a display substrate, wherein the display substrate comprises a base substrate and a display component on the base substrate, and the method comprises:
    forming a first electrode plate of a detection capacitor in a peripheral region of the display substrate, the peripheral region being a region between an effective display area and a frame of the display substrate;
    forming an encapsulation layer covering the display component, wherein the encapsulation layer comprises an organic layer and an inorganic layer that are stacked; and
    forming a second electrode plate of the detection capacitor on a side of the encapsulation layer away from the base substrate, wherein the encapsulation layer is located between the first electrode plate and the second electrode plate of the detection capacitor.

17. The method according to claim 16, wherein the display component comprises a source-drain metal layer pattern or an anode layer, and forming the first electrode plate of the detection capacitor comprises:
    forming the first electrode plate and the source-drain metal layer pattern of the display component simultaneously through one patterning process; or forming the first electrode plate and the anode layer of the display component simultaneously through one patterning process.

18. The method according to claim 16, wherein the display substrate further comprises a touch electrode, and forming the second electrode plate of the detection capacitor comprises:
   forming the second electrode plate and the touch electrode simultaneously through one patterning process.

19. The method according to claim 16, wherein the display substrate further comprises a first blocking structure and a second blocking structure, and orthographic projections of the first electrode plate and second electrode of the detection capacitor onto the base substrate are between an orthographic projection of the first blocking structure onto the base substrate and an orthographic projection of the second blocking structure onto the base substrate.

20. A method for manufacturing a display substrate, wherein the display substrate comprises a base substrate and a display component on the base substrate, and the method comprises:
   forming a first electrode plate of a detection capacitor in a peripheral region of the display substrate, the peripheral region being a region between an effective display area and a frame of the display substrate;
   forming an encapsulation layer covering the display component; and
   forming a second electrode plate of the detection capacitor on a side of the encapsulation layer away from the base substrate,
wherein the display component comprises a source-drain metal layer pattern or an anode layer, and forming the first electrode plate of the detection capacitor comprises:
   forming the first electrode plate and the source-drain metal layer pattern of the display component simultaneously through one patterning process; or forming the first electrode plate and the anode layer of the display component simultaneously through one patterning process.

* * * * *